United States Patent [19]
Jeong et al.

[11] Patent Number: 5,230,972
[45] Date of Patent: Jul. 27, 1993

[54] METHOD OF MANUFACTURING A COLOR FILTER

[75] Inventors: Sang-gi Jeong, Pusan; Han-su Park, Suwon, both of Rep. of Korea

[73] Assignee: Samsung Electronics Co., Ltd., Kyunggi-Do, Rep. of Korea

[21] Appl. No.: 873,577

[22] Filed: Apr. 21, 1992

Related U.S. Application Data

[63] Continuation of Ser. No. 586,410, Sep. 21, 1990, abandoned.

Foreign Application Priority Data

Aug. 10, 1990 [KR] Rep. of Korea .................. 90-12347

[51] Int. Cl.$^5$ .............................................. G03F 9/00
[52] U.S. Cl. ........................................ 430/7; 430/321
[58] Field of Search .................. 430/7, 321, 320, 315; 250/226; 359/68, 308

[56] References Cited

U.S. PATENT DOCUMENTS 4,617,094 10/1986 Kamamori et al. .
4,721,999 1/1988 Takemura et al. ............... 430/321
4,820,619 4/1989 Sanada et al. .

FOREIGN PATENT DOCUMENTS 61199659 3/1977 Japan .
6060757 5/1979 Japan .

Primary Examiner—Charles L. Bowers, Jr.
Assistant Examiner—Thori Chea
Attorney, Agent, or Firm—Morgan & Finnegan

[57] ABSTRACT

A method for manufacturing a color filter including the steps of: coating a photosensitive resin subject to dyeing on a substrate; forming a pattern on the photosensitive resin layer; dyeing the resultant patterned layer with a coloring matter; forming a condenser lens with transparent and dyeing resistant resin on the surface of the dyed pattern layer; and repeating the above processes at least two times eventually to form at least three colored pattern layers. By the method, since the entire thickness of the color filter is reduced and the layer construction is simplified, light transmittance is increased, the sensitivity of the photocell is enhanced as well as materials curtailed.

7 Claims, 2 Drawing Sheets

METHOD OF MANUFACTURING A COLOR FILTER

This is a continuation of co-pending application Ser. No. 07/586,410, filed on Sep. 21, 1990 now abandoned.

FIELD OF THE INVENTION

The present invention relates to a method for manufacturing a color filter, and more particularly to a method for manufacturing color filter having a condenser lens to improve a sensitivity.

BACKGROUND OF THE INVENTION

Recently, according to the increased demand of a video camera for use in the home, it has been required that the video camera be smaller in size and lighter in weight. Therefore, as a pickup device of a video camera, a conventional pickup tube has been changed to a solid state image sensing device. In a charge coupled device or metal oxide semiconductor type solid state image sensing device in which high density semiconductor technolgy is adopted, the tendency of color conversion is accelerated and the resolution is rapidly enhanced according to the progress of high density technology in the semiconductor field.

A color solid state image sensing device has been embodied by adopting a color filter on the photocell array region in the form of a matrix. The color filter has at least three coloring pattern groups, each having color resolution characteristics different from one another. In the case of a combination of three primary colors, the color filter has red, blue and green coloring pattern groups, and in the case of a combination of complementary colors, it has cyan, yellow and magenta coloring pattern groups. Accordingly, to manufacture the color filter on the photocell array region of the solid state image sensing device, processes of coating photosensitive resins, exposure, development, dyeing and color mixture prevention should be carried out at least three times. Accordingly, the color filter has a structure in which a plurality of layers are laminated so that it becomes very thick. Therefore, in such a thick color filter the quantity of transmitted light eventually arriving at the photocell array is decreased, thereby lowering the sensitivity of the solid state image sensing device.

To solve the problem of the decrease of light transmittance due to the thickness of the color filter, Japanese patent laid-open publication No. 61-199659 discloses a technique for enhancing the sensitivity by focusing the light onto each photocell after forming the condenser lens array on a surface of the color filter to be overlapped with the photocell array. However, this system is very complicated in its structure.

SUMMARY OF THE INVENTION

The object of the present invention is to provide a method for manufacturing a color filter in which the quantity of transmitted light can be increased.

Another object of the present invention is to provide a method for manufacturing a color filter which can improve the sensitivity of a solid state image sensing device.

Yet another object of the present invention is to provide a method for manufacturing an economical color filter by the simplification of the manufacturing process and the curtailment of materials.

For carrying out the above and other objects, the method for manufacturing the color filter according to the present invention comprises the steps of: (a) coating a photosensitive resin subject to dyeing on a substrate; (b) exposing and developing a predetermined pattern on the photosensitive resin layer formed in the above process and leaving the predetermined pattern; (c) dyeing the patterned layer with a predetermined coloring matter; (d) forming a condenser lens having a predetermined radius of curvature on the surface of the dyed pattern layer; and repeating the above-mentioned serial processes (a) to (d) at least two times eventually to form at least three colored pattern layers.

Here, when a semiconductor substrate is used as a solid state image sensing device, before coating of the photosensitive resin, a surface planarizing process and a process for coating a bonding pad protection layer are first carried out. At this time, optimum focusing is obtained by controlling the thickness of a planarizing layer.

And, heat resistant and dyeing resistant materials are used for forming the condenser lens. Accordingly, the condenser lens has a color mixture prevention function, so that the intermediate layers for the color mixture prevention can be removed, thereby reducing the entire thickness of the color filter.

These and other objects, features and advantages of the present invention will become more apparent upon consideration of the following description of the preferred embodiments of the present invention taken in conjunction with the accompanying drawings.

DESCRIPTION OF THE PREFERRED EMBODIMENT OF THE INVENTION

To begin with, prior to explaining the preferred embodiment according to the present invention, a method for manufacturing a conventional color filter will be explained below with reference to FIG. 1A to FIG. 1E.

Figure 1A:
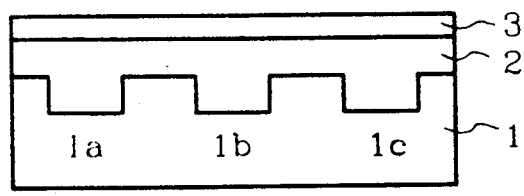
FIG. 1A to FIG. 1E illustrate a method for manufacturing the conventional color filter.

Referring to FIG. 1A, the reference numeral 1 designates a semiconductor substrate of the solid state image sensing device having prominences and recesses in the upper portion thereof. The semiconductor substrate 1 is a portion of the photocell array region and has photocells 1a, 1b and 1c in the respective recesses. The photocells are photodiodes formed in the semiconductor substrate 1. In the prominence of the semiconductor substrate 1, an insulating layer and a conductive layer for wiring are formed. On the upper surface of the semiconductor substrate in which the prominence and recess portions are formed, a planarizing layer 2 is formed by coating an organic high polymer material such as a polyimide, and then a protective layer 3 having dyeing resistance is coated for protecting a bonding pad which is not shown. The protective layer 3 prevents the bonding pad from corrosion during the formation of the colored pattern discussed later.

Figure 1B:
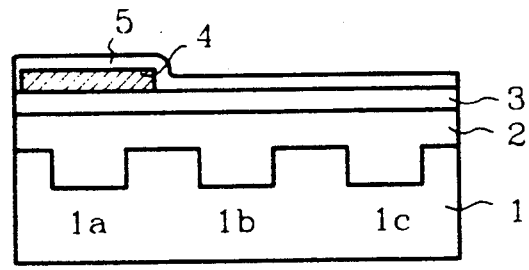

Referring to FIG. 1B, on the surface of the protective layer 3, the photosensitive resin such as a gelatin or casein containing chlorine dichromate is coated and then a first colored pattern 4 is formed by exposing and developing the predetermined portion of the layer 3 to be left via photolithographic process. Thereafter, a color mixture prevention material such as a polyglicidyl methacrylate is coated on the surface of the resultant structure in which the first colored pattern 4 is formed. By the process shown in FIG. 1B, the first color pattern layer 4 is formed on the protective layer 3 and is disposed above the photocell 1a.

Figure 1C:
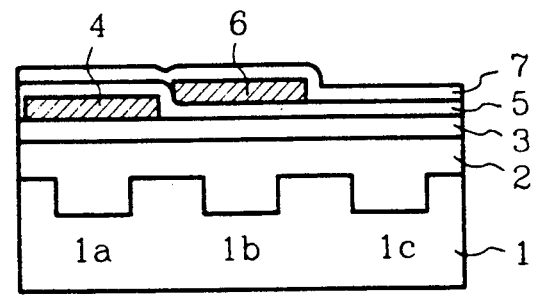
Figure 1D:
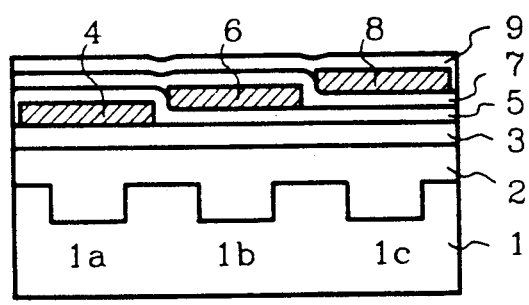

If the process of FIG. 1B is twice repeated sequencially with respect to photocells 1b and 1c, a second colored pattern layer 6, an intermediate layer 7, a third colored pattern layer 8 and an intermediate layer 9 are sequentially formed as shown in FIG. 1C and FIG. 1D.

Figure 1E:
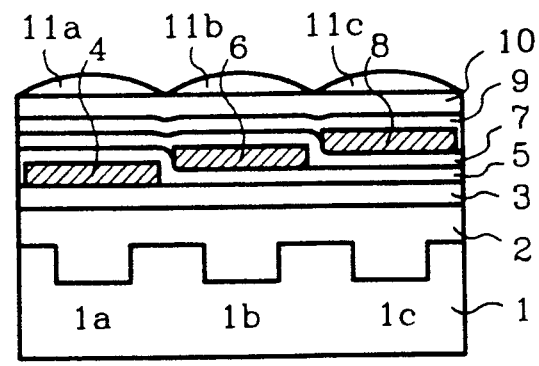

Referring to FIG. 1E, on a surface of the resultant structure in which the first, second and third colored pattern layers 4,6 and 8, and intermediate layers 5, 7 and 9 are formed by the above processes, a focus controlling layer 10 is formed by coating such materials as polyglicidyl methacrylate with a predetermined thickness. Thereafter, a transparent resin material such as an acrylic resin is coated on the focus controlling layer 10 and then patterned to be overlapped with the photocells by the photolithographic process and heated at a predetermined temperature to reflow, and then softbaked. Thus, a condenser lens having a predetermined radius of curvature can be obtained (Refer to Japanese Patent laid-open No. 60-60757).

As illustrated, in FIG. 1A to FIG. 1E, since the color filter mounted on the solid state image sensing device has at least three intermediate layers for preventing color mixture, the entire structure thereof becomes very thick, measuring about 10 to 12 μm. Accordingly, an optical path leading to the photocell is complicated and the sensitivity is lowered due to the reduction of the light transmitted.

Also, since many steps of processes are needed to manufacture the color filter and a plurality of the intermediate layers should be formed, it has such problems that operation efficiency is lowered and waste of materials occurs.

Next, a specific embodiment of the present invention will be explained with respect to FIGS. 2A to 2D.

Figure 2A:
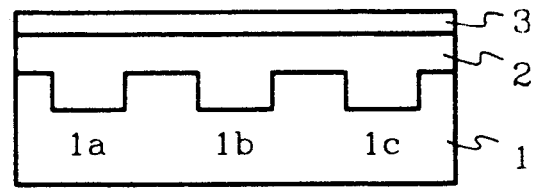
FIG. 2A to FIG. 2D illustrate a method for manufacturing a color filter according to the present invention.

The process illustrated in FIG. 2A is the same as that of FIG. 1A.

Figure 2B:
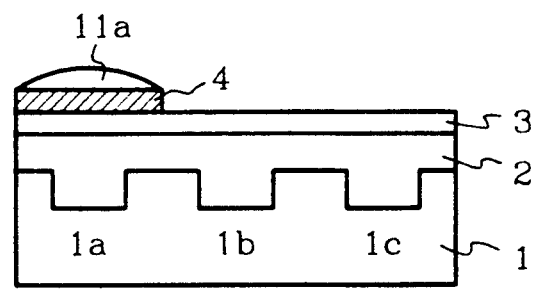

The process illustrated in FIG. 2B is the same as that of FIG. 1B except that the intermediate layer 5 for preventing the color mixture is replaced by a condenser lens 11a. In more detail, after coating the photosensitive resin on the protective layer 3 and leaving the first colored pattern layer 4 through the exposure and development process, the condenser lens 11a is formed with a transparent resin on the first colored pattern layer having good heat resistance and dyeing resistance through the known lens forming technology. Accordingly, the condenser lens 11a has a color mixture prevention function as well as focusing function, thereby preventing the color mixture of the first colored pattern layer 4 during the next dyeing process.

Figure 2C:
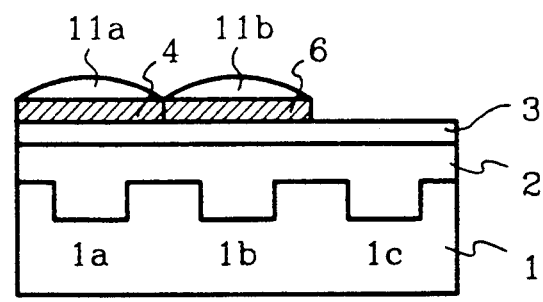
Figure 2D:
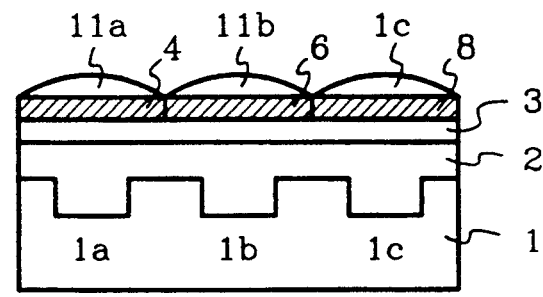

In FIG. 2C and FIG. 2D, a second colored pattern layer 6, a condenser lens 11b, a third colored pattern layer 8 and a condenser lens 11c are formed by sequentially repeating such process as shown in FIG. 2B. Here, base resistant material can be used for forming the condenser lenses 11a, 11b and 11c. Also, if the condenser lenses 11a, 11b and 11c are formed with the photosensitive resin, it is preferable to use a photosensitive resin having a radiation sensitivity characteristic different from that of the colored pattern layers 4, 6 and 8, in view of the simplication of the process.

As mentioned above, according to the present invention, the coating process of the color mixture preventing intermediate layers 5, 7 and 9 is no longer necessary after forming colored pattern layers 4, 6 and 8, but instead the condenser lenses are formed one by one directly on the colored pattern layer, thereby preventing the occurance of the undesirable color mixture. As a result, the intermediate layers 5, 7 and 9 can be removed, so that entire thickness of the color filter can be reduced to 5~6 μm.

Therefore, according to the present invention, since the entire thickness of the color filter is reduced and the layer construction is simplified, light transmittance is increased and, the sensitivity of the photocell is enhanced as well as materials curtailed.

What is claimed is:

1. A method for manufacturing a color filter, comprising the steps of:
   (a) coating a photosensitive resin layer subject to dyeing on a protective layer;
   (b) exposing and developing the photosensitive resin layer formed in the preceding step to form a first colored pattern layer having a predetermined pattern;
   (c) dyeing the resultant patterned layer with a predetermined coloring matter;
   (d) forming a condenser lens having a predetermined radius of curvature by means of a transparent and dyeing resistant resin on the surface of the dyed pattern layer; and
   (e) repeating the above-mentioned steps (a)-(d) at least two times to eventually form on the protective layer at least three colored pattern layers having condenser lenses thereon.

2. A method as claimed in claim 1, wherein said condenser lens is formed with a photosensitive resin having a radiation sensitivity characteristic different from that of the photosensitive resin layer.

3. A method as claimed in claim 1, wherein said condenser lens is formed with an acryl resin.

4. A method as claimed in claim 1, wherein said substrate is a solid image sensing device, and said method further comprises the steps of:
   planarizing the surface of said substrate by forming a planarizing layer, prior to coating said first photosensitive resin, in such a manner that an organic high polymer material of polyimide group is coated on the photocell array region of said solid state image sensing device along with controlling the thickness of the layer to allow incident light to be focussed on said photocell; and
   coating a protective layer to protect a bonding pad disposed on a pheriphery of said photocell array region.

5. A method as claimed in claim 4, wherein the entire thickness of the color filter mounted on a predetermined region of said solid state image sensing device is about 5~6 μm.

6. A method as claimed in any one of claims 1 through 4, wherein each of at least three colored pattern layers is dyed with one of red, blue, or green colors.

7. A method as claimed in any one of claims 1 through 4, wherein each of the colored pattern layers is dyed with one of cyan, yellow, or magenta colors.

* * * * *